United States Patent
Yamamoto

(10) Patent No.: US 8,023,099 B2
(45) Date of Patent: Sep. 20, 2011

(54) SUBSTRATE PROCESSING SYSTEM AND SUBSTRATE PROCESSING METHOD FOR DOUBLE PATTERNING WITH CARRIER BLOCK, PROCESS SECTION, AND INTERFACE BLOCK

(75) Inventor: Yuichi Yamamoto, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 275 days.

(21) Appl. No.: 12/264,341

(22) Filed: Nov. 4, 2008

(65) Prior Publication Data

US 2009/0142713 A1 Jun. 4, 2009

(30) Foreign Application Priority Data

Nov. 29, 2007 (JP) ................................. 2007-308390

(51) Int. Cl.
*G03B 27/52* (2006.01)
(52) U.S. Cl. ......................................................... 355/27
(58) Field of Classification Search .................... 355/27, 355/53; 396/611; 430/325; 118/52, 58, 118/59, 66; 414/935
See application file for complete search history.

(56) References Cited

U.S. PATENT DOCUMENTS

| | | | | |
|---|---|---|---|---|
| 5,100,508 | A * | 3/1992 | Yoshida et al. | 430/312 |
| 6,893,171 | B2 * | 5/2005 | Fukutomi et al. | 396/611 |
| 7,403,260 | B2 | 7/2008 | Matsuoka et al. | |
| 7,563,323 | B2 * | 7/2009 | Hashinoki et al. | 118/66 |
| 2006/0201616 | A1 | 9/2006 | Matsuoka et al. | |

FOREIGN PATENT DOCUMENTS

| | | |
|---|---|---|
| JP | 3-139821 | 6/1991 |
| JP | 7-147219 | 6/1995 |
| JP | 11-329939 | 11/1999 |
| JP | 2001-291654 | 10/2001 |
| JP | 2003-324139 | 11/2003 |
| JP | 2005-101058 | 4/2005 |
| JP | 2006-308390 A | 11/2006 |

OTHER PUBLICATIONS

English translation of JP 2001-291654 (dated Oct. 19, 2001).*
English translation of JP 7-147219 (dated Jun. 6, 1995).*
English translation of JP 11-329939 (dated Nov. 30, 1999).*
English translation of JP 2006-308390 (dated Nov. 9, 2006).*

* cited by examiner

*Primary Examiner* — Peter B Kim
*Assistant Examiner* — Chia-how Michael Liu
(74) *Attorney, Agent, or Firm* — Oblon, Spivak, McClelland, Maier & Neustadt, L.L.P.

(57) ABSTRACT

A substrate processing system is used for a light exposure apparatus which performs light exposure at least twice on each of substrates. The system includes a carrier block, and a process section configured to process each of substrates transferred from the carrier block one by one. The process section includes a first coating process section configured to perform a first coating process, a first developing process section configured to perform a first developing process, a second coating process section configured to perform a second coating process, and a second developing process section configured to perform a second developing process. The system further includes an interface block configured to transfer substrates between the process section and the light exposure apparatus, and a substrate transfer mechanism configured to transfer substrates among them.

15 Claims, 11 Drawing Sheets

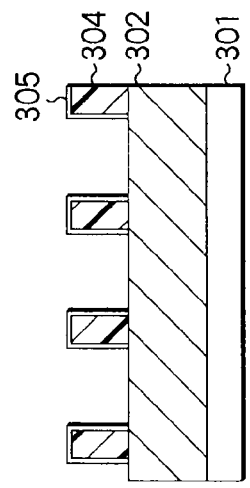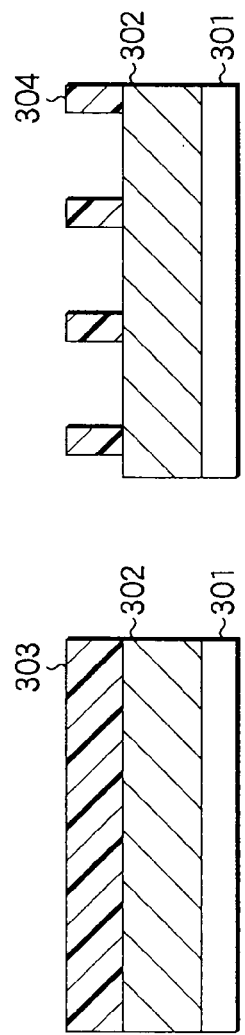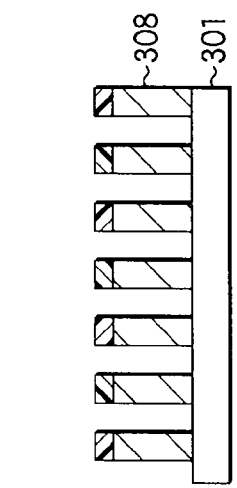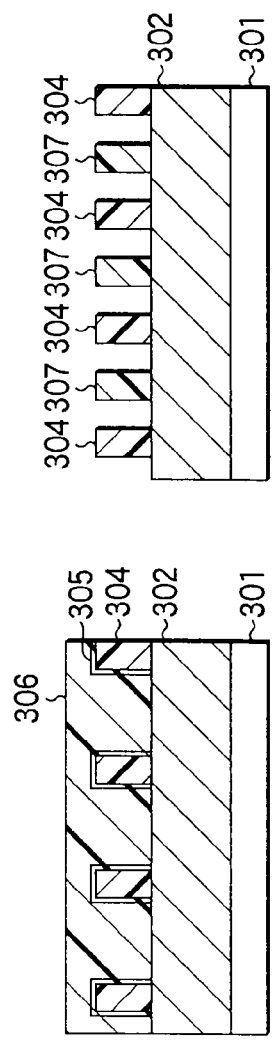

SUBSTRATE PROCESSING SYSTEM AND SUBSTRATE PROCESSING METHOD FOR DOUBLE PATTERNING WITH CARRIER BLOCK, PROCESS SECTION, AND INTERFACE BLOCK

BACKGROUND OF THE INVENTION

1. Field of the Invention

The present invention relates to a substrate processing system and substrate processing method suitable for a technique which performs patterning a plurality of times on a target film disposed on a substrate, such as a semiconductor wafer.

2. Description of the Related Art

In the process of manufacturing semiconductor devices, a photolithography technique is used for forming a circuit pattern on a target substrate, such as a semiconductor wafer (which may be simply referred to as "wafer" hereinafter). Where a circuit pattern is formed by use of photolithography, a resist film is formed by applying a resist liquid onto a wafer, and is then subjected to light exposure for irradiating the resist film with light in accordance with the circuit pattern, and to a subsequent developing process.

In recent years, semiconductor devices tend to be highly integrated to improve the operation speed and so forth, and photolithography techniques are required to increase the miniaturization level of circuit patterns to be formed on wafers. Conventionally, in light of such demands, an improvement has been made by shortening the wavelength of light used for light exposure. However, this improvement is not sufficient to form ultrafine semiconductor devices of the 45-nm node generation and thereafter.

As a patterning technique for forming ultrafine semiconductor devices of the 45-nm node generation and thereafter, there has been proposed techniques which perform patterning a plurality of times to form a single layer pattern (for example, Jpn. Pat. Appln. KOKAI Publication No. 7-147219). Of them, a technique which performs patterning twice is called double patterning.

In double patterning, light exposure is performed twice by use of different light exposure patterns to form a single layer pattern, and so conventional systems need to repeat photolithography and etching twice. However, in this case, the cost for forming a single layer pattern is doubled and the number of steps is increased, resulting in problems concerning the productivity. In order to solve these problems, there has been proposed a technique which repeats photolithography twice by use of different light exposure patterns and then performs etching.

However, so far, there are no established systems or methods that can efficiently perform double patterning by use of this technique.

BRIEF SUMMARY OF THE INVENTION

An object of the present invention is to provide a substrate processing system and substrate processing method that can efficiently perform patterning a plurality of times on a single layer.

According to a first aspect of the present invention, there is provided a substrate processing system used for a light exposure apparatus which performs light exposure at least twice on each of substrates, the substrate processing system comprising: a carrier block configured to transfer therefrom and thereto a carrier for storing a plurality of substrates; a process section configured to perform a coating process for forming a coating film including a photosensitive material film on each of substrates transferred from the carrier block one by one, and to perform a developing process for developing the photosensitive material film subjected to light exposure in accordance with a predetermined light exposure pattern; an interface block configured to transfer substrates between the process section and the light exposure apparatus which performs light exposure on the photosensitive material film in accordance with a predetermined light exposure pattern; and a substrate transfer mechanism configured to transfer substrates among the carrier block, the process section, and the interface block, wherein the process section includes a first coating process section configured to perform a first coating process and a first developing process section configured to perform a first developing process for a first light exposure, and a second coating process section configured to perform a second coating process and a second developing process section configured to perform a second developing process for a second light exposure.

In the first aspect, the interface block may include a buffer unit for buffering of a plurality of substrates.

According to a second aspect of the present invention, there is provided a substrate processing system used for a light exposure apparatus which performs light exposure at least twice on each of substrates, the substrate processing system comprising: a carrier block configured to transfer therefrom and thereto a carrier for storing a plurality of substrates; a process section configured to perform a coating process for forming a coating film including a photosensitive material film on each of substrates transferred from the carrier block one by one, and to perform a developing process for developing the photosensitive material film subjected to light exposure in accordance with a predetermined light exposure pattern; an interface block configured to transfer substrates between the process section and the light exposure apparatus which performs light exposure on the photosensitive material film in accordance with a predetermined light exposure pattern; and a substrate transfer mechanism configured to transfer substrates among the carrier block, the process section, and the interface block, wherein the process section includes a first coating process section configured to perform a first coating process and a first developing process section configured to perform a first developing process for a first light exposure, and a second coating process section configured to perform a second coating process and a second developing process section configured to perform a second developing process for a second light exposure, and the interface block includes a buffer unit for buffering of a plurality of substrates to perform buffering of substrates in the interface block to set throughput thereof to be a half of throughput of the light exposure apparatus.

In the first and second aspects, the buffer unit may include a loading buffer cassette for buffering of substrates to be loaded into the light exposure apparatus. The buffer unit may further include an unloading buffer cassette for buffering of substrates unloaded from the light exposure apparatus. The loading buffer cassette or both of the loading buffer cassette and the unloading buffer cassette preferably comprise a cassette for the first light exposure and a cassette for the second light exposure.

The substrate processing system preferably further comprises a transfer control mechanism configured to control the substrate transfer mechanism in transfer of substrates, and the transfer control mechanism is preset to control the substrate transfer mechanism, such that each substrate is transferred from a carrier in the carrier block into the first coating process section in the process section, then the substrate subjected to a coating process in the first coating process section is transferred through the interface block into the light exposure apparatus, then the substrate subjected to the first light exposure in the light exposure apparatus is transferred through the interface block into the first developing process section in the process section, then the substrate subjected to a developing process in the first developing process section is transferred into the second coating process section, then the substrate subjected to a coating process in the second coating process section is transferred through the interface block into the light exposure apparatus, then the substrate subjected to the second light exposure in the light exposure apparatus is transferred through the interface block into the second developing process section in the process section, and then the substrate subjected to a developing process in the second developing process section is transferred into a carrier in the carrier block.

The first coating process section, the first developing process section, the second coating process section, and the second developing process section may be stacked. In this case, the substrate processing system may be arranged such that the second developing process section and the first coating process section are stacked in this order from below to form a first multi-layered body, the first developing process section and the second coating process section are stacked in this order from below to form a second multi-layered body, and the first and second multi-layered bodies are disposed side by side. The substrate processing system is preferably arranged such that each of the first coating process section and the second coating process section includes a photosensitive material film coating process layer that comprises integrated units for coating the photosensitive material film, each of the first developing process section and the second developing process section includes a developing process layer that comprises integrated units for performing a developing process, and the transfer mechanism includes main transfer devices configured to transfer substrates to the units respectively in the photosensitive material film coating process layer and the developing process layer, and delivery mechanisms connecting the process layers respectively in the first multi-layered body and the second multi-layered body.

In addition to the photosensitive material film coating process layer, the first coating process section may include at least one of a lower anti-reflective film coating process layer that comprises integrated units for forming an anti-reflective film below the photosensitive material film, and an upper anti-reflective film coating process layer that comprises integrated units for forming an anti-reflective film above the photosensitive material film. In addition to the photosensitive material film coating process layer, the second coating process section may include a cleaning/surface process layer that comprises integrated units for performing at least one of a cleaning process and a surface process on a coating film formed by a coating process in the first coating process section. In this case, the cleaning/surface process layer may be configured to perform a curing process as the surface process. In addition to the photosensitive material film coating process layer, the second coating process section may include an upper anti-reflective film coating process layer that comprises integrated units for forming an anti-reflective film above the photosensitive material film.

According to a third aspect of the present invention, there is provided a substrate processing method executed in a substrate processing system used for a light exposure apparatus which performs light exposure at least twice on each of substrates, the substrate processing system comprising a carrier block configured to transfer therefrom and thereto a carrier for storing a plurality of substrates, a process section configured to perform a coating process for forming a coating film including a photosensitive material film on each of substrates transferred from the carrier block one by one, and to perform a developing process for developing the photosensitive material film subjected to light exposure in accordance with a predetermined light exposure pattern, an interface block configured to transfer substrates between the process section and the light exposure apparatus which performs light exposure on the photosensitive material film in accordance with a predetermined light exposure pattern, and a substrate transfer mechanism configured to transfer substrates among the carrier block, the process section, and the interface block, wherein the process section includes a first coating process section configured to perform a first coating process and a first developing process section configured to perform a first developing process for a first light exposure, and a second coating process section configured to perform a second coating process and a second developing process section configured to perform a second developing process for a second light exposure, the substrate processing method comprising: transferring substrates, such that each substrate is transferred from a carrier in the carrier block into the first coating process section in the process section, then the substrate subjected to a coating process in the first coating process section is transferred through the interface block into the light exposure apparatus, then the substrate subjected to the first light exposure in the light exposure apparatus is transferred through the interface block into the first developing process section in the process section, then the substrate subjected to a developing process in the first developing process section is transferred into the second coating process section, then the substrate subjected to a coating process in the second coating process section is transferred through the interface block into the light exposure apparatus, then the substrate subjected to the second light exposure in the light exposure apparatus is transferred through the interface block into the second developing process section in the process section, and then the substrate subjected to a developing process in the second developing process section is transferred into a carrier in the carrier block.

According to a fourth aspect of the present invention, there is provided a substrate processing method executed in a substrate processing system used for a light exposure apparatus which performs light exposure at least twice on each of substrates, the substrate processing system comprising a carrier block configured to transfer therefrom and thereto a carrier for storing a plurality of substrates, a process section configured to perform a coating process for forming a coating film including a photosensitive material film on each of substrates transferred from the carrier block one by one, and to perform a developing process for developing the photosensitive material film subjected to light exposure in accordance with a predetermined light exposure pattern, an interface block configured to transfer substrates between the process section and the light exposure apparatus which performs light exposure on the photosensitive material film in accordance with a predetermined light exposure pattern, and a substrate transfer mechanism configured to transfer substrates among the carrier block, the process section, and the interface block, wherein the process section includes a first coating process section configured to perform a first coating process and a first developing process section configured to perform a first developing process for a first light exposure, and a second coating process section configured to perform a second coating process and a second developing process section configured to perform a second developing process for a second light exposure, the substrate processing method comprising:

performing buffering of substrates in the interface block to set throughput thereof to be a half of throughput of the light exposure apparatus.

According to a fifth aspect of the present invention, there is provided a computer readable storage medium that stores a program for execution on a computer to control a substrate processing system used for a light exposure apparatus which performs light exposure at least twice on each of substrates, the substrate processing system comprising a carrier block configured to transfer therefrom and thereto a carrier for storing a plurality of substrates, a process section configured to perform a coating process for forming a coating film including a photosensitive material film on each of substrates transferred from the carrier block one by one, and to perform a developing process for developing the photosensitive material film subjected to light exposure in accordance with a predetermined light exposure pattern, an interface block configured to transfer substrates between the process section and the light exposure apparatus which performs light exposure on the photosensitive material film in accordance with a predetermined light exposure pattern, and a substrate transfer mechanism configured to transfer substrates among the carrier block, the process section, and the interface block, wherein the process section includes a first coating process section configured to perform a first coating process and a first developing process section configured to perform a first developing process for a first light exposure, and a second coating process section configured to perform a second coating process and a second developing process section configured to perform a second developing process for a second light exposure, wherein the program, when executed, causes the computer to control the substrate processing system to conduct the substrate processing method according to the third or fourth aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 11A to 11F are views showing a sequence of double patterning which repeats photolithography patterning twice.

DETAILED DESCRIPTION OF THE INVENTION

Figure 1:
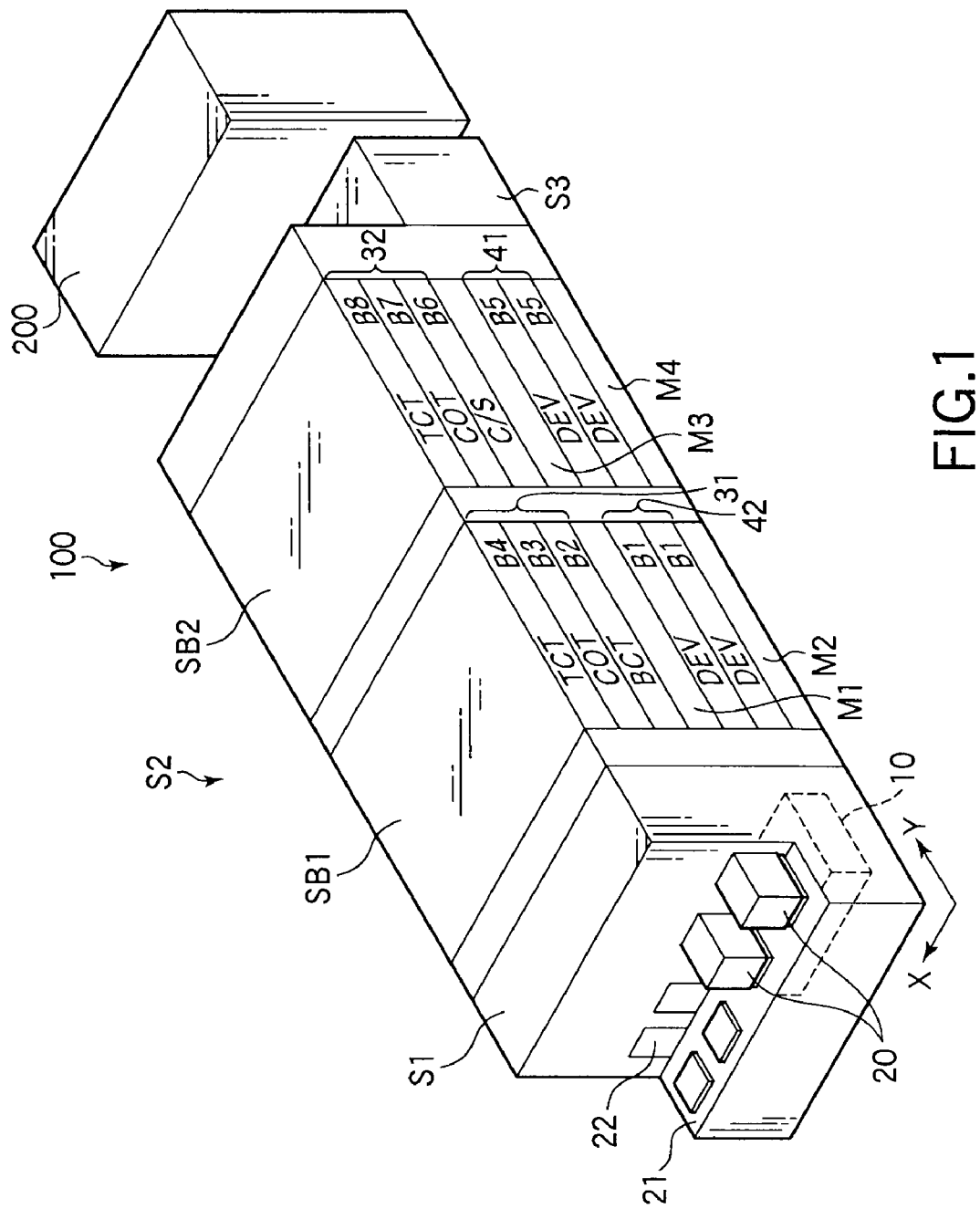
FIG. 1 is a perspective view schematically showing a substrate processing system according to an embodiment of the present invention.
Figure 2:
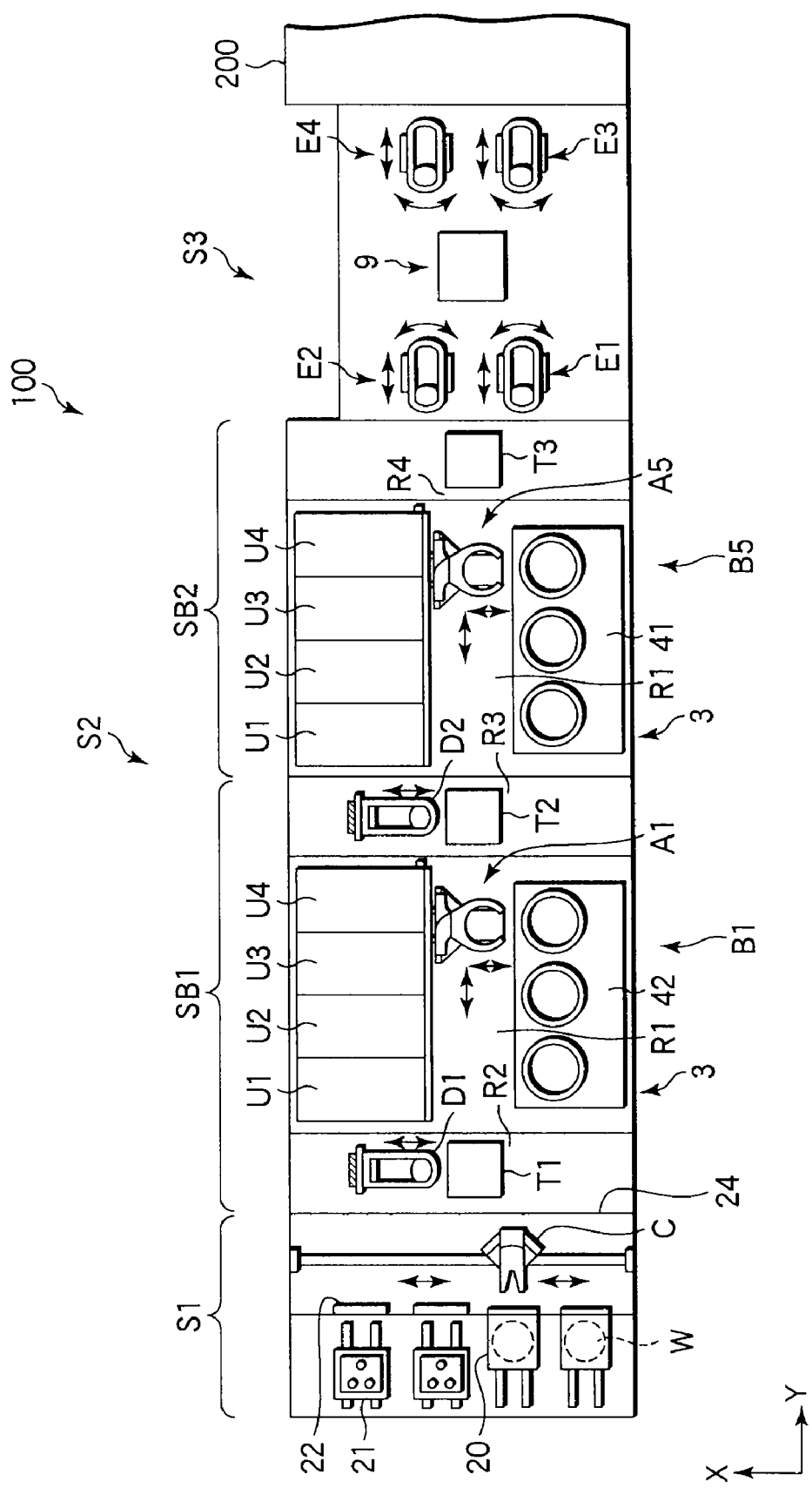
FIG. 2 is a sectional plan view schematically showing part of the substrate processing system shown in FIG. 1 corresponding to a DEV layer.
Figure 3:
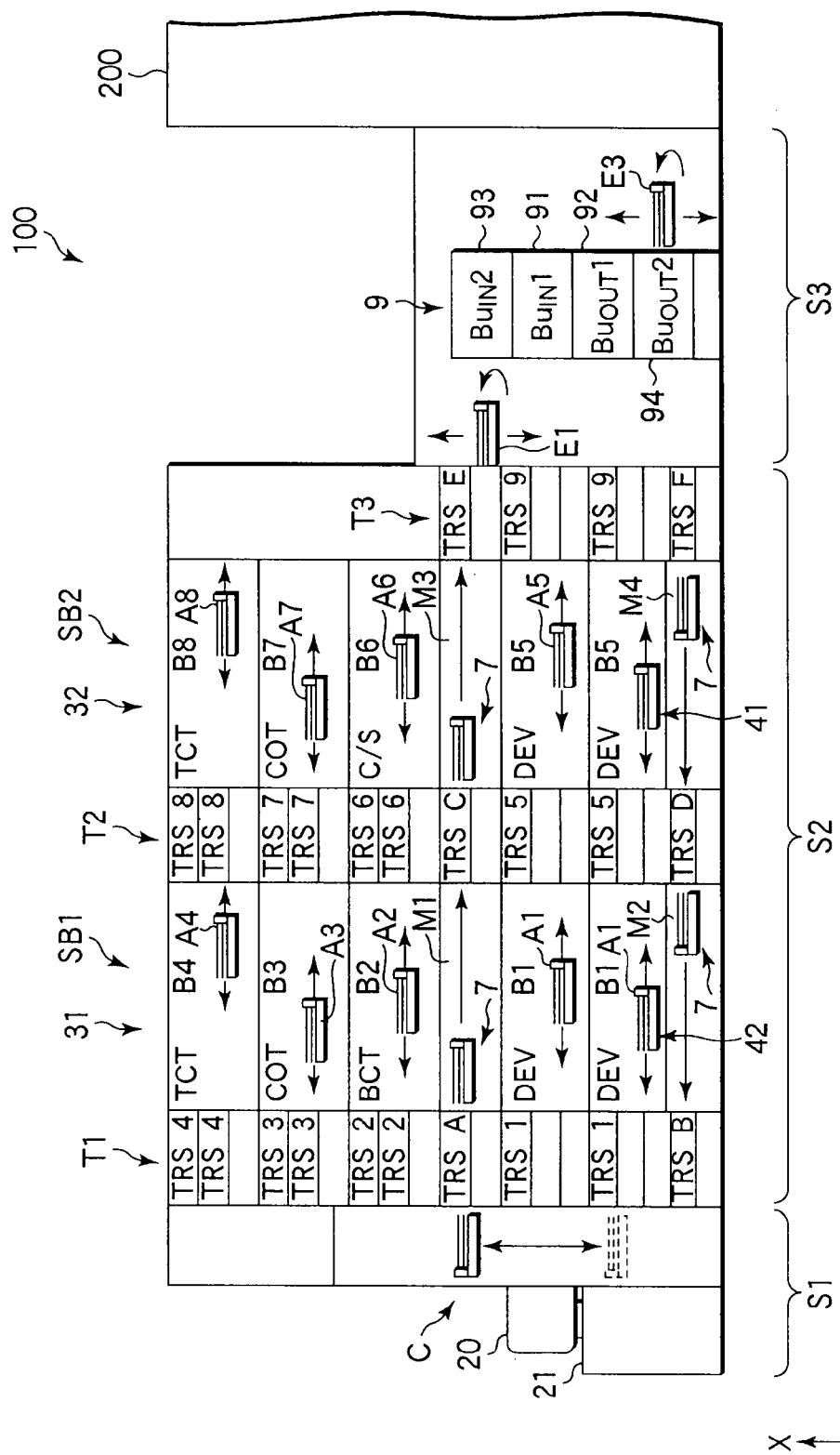
FIG. 3 is a side view schematically showing the substrate processing system shown in FIG. 1.

An embodiment of the present invention will now be described with reference to the accompanying drawings. FIG. 1 is a perspective view schematically showing a substrate processing system according to an embodiment of the present invention. FIG. 2 is a sectional plan view schematically showing part of the substrate processing system shown in FIG. 1 corresponding to a DEV layer. FIG. 3 is a side view schematically showing the substrate processing system shown in FIG. 1.

The substrate processing system 100 is designed to perform a coating process for forming a coating film including a photo-resist on a wafer and a developing process after light exposure so as to realize double patterning which performs patterning twice. The substrate processing system 100 is installed in a clean room having an atmospheric environment. The substrate processing system 100 includes a carrier block S1, a process block S2, and an interface block S3. The carrier block S1 is used for loading/unloading carriers 20 each for storing a plurality of target substrates or wafers W. The process block S2 is used for performing a coating process to form a coating film including a photo-resist film made of a photosensitive material on wafers W, and for performing a developing process to develop the photo-resist film after it is subjected to light exposure in accordance with a predetermined light exposure pattern. The interface block S3 is connected to a light exposure apparatus 200 in use.

As shown in FIG. 1, a control section 10 is disposed below the carrier block S1 to control the substrate process system 100 as a whole. The control section 10 will be explained later in detail. The light exposure apparatus 200 is also provided with a control section (not shown).

In FIGS. 1 to 3, the width direction of the substrate processing system 100 is an X-direction, the array direction of the carrier block S1, process block S2, and interface block S3 orthogonal thereto is a Y-direction, and the vertical direction is a Z-direction.

The carrier block S1 includes a table 21 for placing thereon a plurality of carriers 20, door portions 22 formed in a wall on the forward side of the table 21, and a transfer arm C for transferring wafers W to and from the carriers 20 through the door portions 22. The transfer arm C is movable back and forth and up and down, rotatable about a vertical axis, and further movable in the array direction of the carriers 20.

The process block S2 is surrounded by a casing 24 and is connected to the carrier block S1. The process block S2 includes first and second sub-blocks SB1 and SB2 arrayed in the Y-direction, wherein each sub-block includes a plurality of process layers stacked one on top of the other.

The first sub-block SB1 includes a second developing process section 42 for performing the second (second round) developing process on the lower side and a first coating process section 31 disposed thereon for performing the first (first round) coating process. The second developing process section 42 includes two developing process layers (DEV layers) B1 having the same structure and stacked one on top of the other. The first coating process section 31 includes a lower anti-reflective film coating process layer (BCT layer) B2 for performing a coating process to form a lower anti-reflective film present below the resist film, a resist coating process layer (COT layer) B3 for performing a coating process of a resist liquid, and an upper anti-reflective film coating process layer (TCT layer) B4 for performing a coating process to form an upper anti-reflective film present above the resist film. The process layers B2, B3, and B4 are stacked in this order from below. The first sub-block SB1 includes a first transfer layer M1 between the second developing process section 42 and first coating process section 31, and a second transfer layer M2 as the lowermost layer.

The second sub-block SB2 includes a first developing process section 41 for performing the first (first round) developing process on the lower side and a second coating process section 32 disposed thereon for performing the second (second round) coating process. The first developing process section 41 includes two developing process layers (DEV layers) B5 having the same structure and stacked one on top of the other. The DEV layers B5 have the same structure as the DEV layers B1. The second coating process section 32 includes a cleaning/surface process layer (C/S layer) B6 for performing a cleaning process and/or a surface process, such as a curing process, for the upper anti-reflective film. The process layer B6 is disposed to prevent particles from being present on the film surface in starting a coating process and/or to prevent reaching from being caused, when the second coating process is performed on the upper anti-reflective film, which is the uppermost layer formed by the first coating process. The second coating process section 32 further includes a resist coating layer (COT layer) B7 for performing a coating process of a resist liquid, and an upper anti-reflective film coating process layer (TCT layer) B8 for performing a coating process to form an upper anti-reflective film present above the resist film. The process layers B6, B7, and B8 are stacked in this order from below. The second sub-block SB2 includes a third transfer layer M3 between the first developing process section 41 and second coating process section 32, and a fourth transfer layer M4 as the lowermost layer. The respective layers of the first and second sub-blocks SB1 and SB2 are partitioned by partition plates (bases)

The process block S2 includes a first transfer shelf unit T1 on the carrier block S1 side, which comprises a plurality of transit stages arrayed in the vertical direction along the process layers B1 to B4 and transfer layers M1 and M2. The process block S2 further includes a second transfer shelf unit T2 between the first sub-block SB1 and second sub-block SB2, which comprises a plurality of transit stages arrayed in the vertical direction along the process layers B1 to B4 and transfer layers M1 and M2, and the process layers B5 to B8 and transfer layers M3 and M4. The process block S2 further includes a third transfer shelf unit T3 on the interface block S3 side, which comprises a plurality of transit stages arrayed in the vertical direction along the process layers B5 to B8 and transfer layers M3 and M4.

Next, an explanation will be given of the structure of the process layers B1 to B8 and transfer layers M1 to M4.

Figure 4:
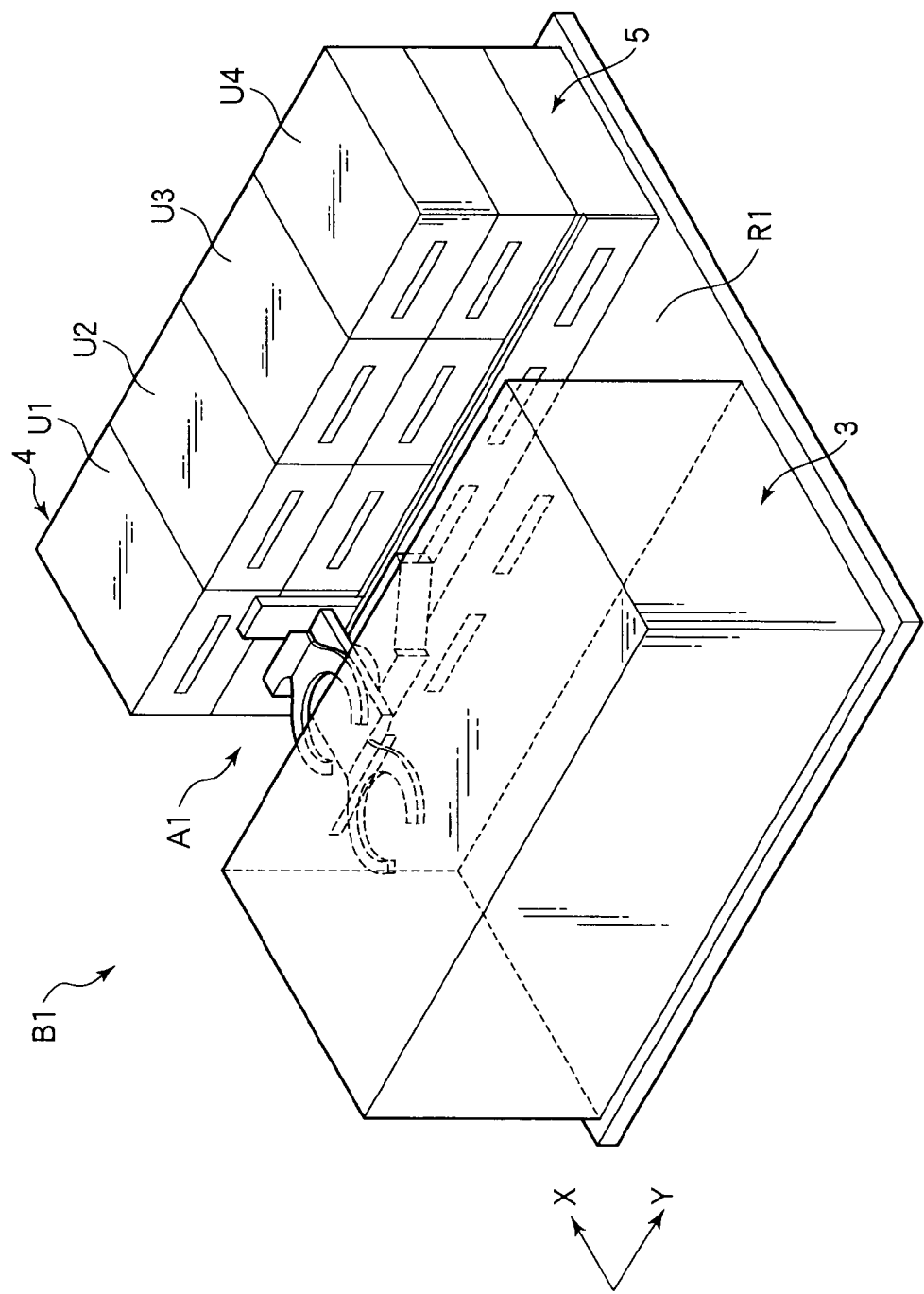
FIG. 4 is a perspective view showing the layout of the DEV layer.

In this embodiment, the process layers B1 to B8 include a lot of common portions, and have almost the same layout as each other. Accordingly, the DEV layers B1 will be explained as a representative with reference to FIG. 4. Each of the DEV layers B1 includes a transfer passage R1 at the central portion, along which a main transfer arm (main arm) A1 for transferring wafers W in the Y-direction is movable.

On one side of the transfer passage R1, a liquid process unit or developing unit 3, which includes a plurality of coating portions for performing a coating process of a developing liquid, is disposed along the transfer passage R1. On the other side of the transfer passage R1, four shelf units U1, U2, U3, and U4 formed of thermal process units of the heating/cooling type and exhaust units 5 are stacked along the transfer passage R1. Accordingly, the developing unit 3 faces the shelf units U1 to U4 with the transfer passage R1 interposed therebetween.

Figure 5A:
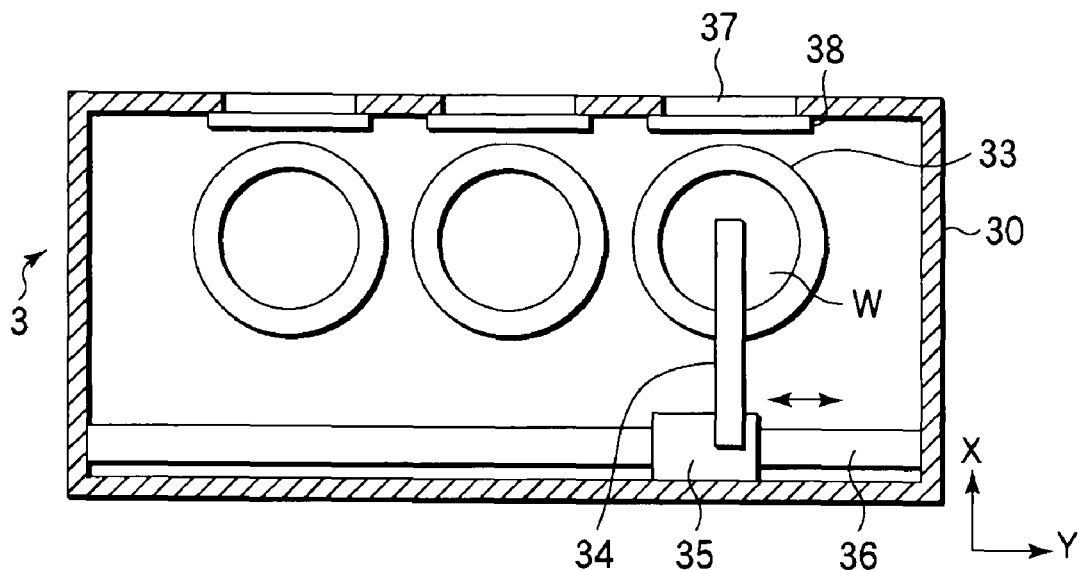
FIGS. 5A and 5B are a sectional plan view and a sectional side view schematically showing a developing unit in the DEV layer.
Figure 5B:
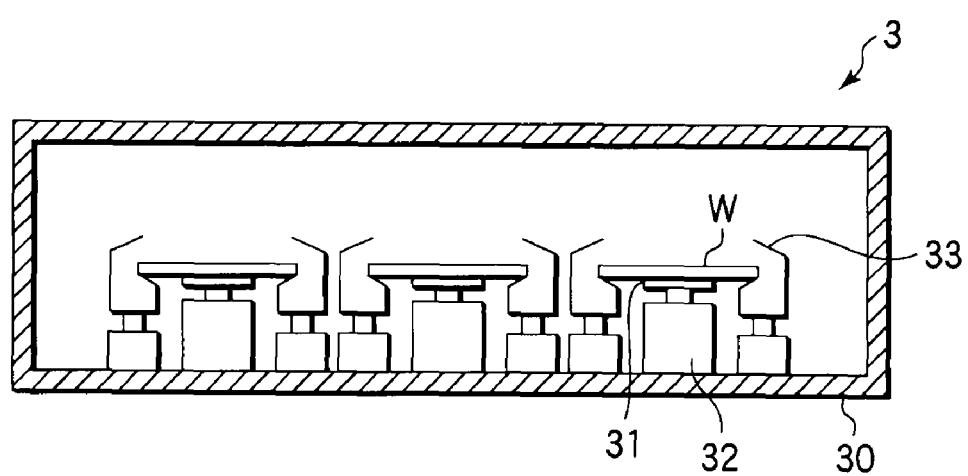

As shown in FIGS. 5A and 5B, the developing unit 3 includes a casing 30, in which three wafer holders or spin chucks 31 are arrayed. Each of the spin chucks 31 is rotatable about a vertical axis and movable up and down by a drive portion 32. The spin chuck 31 is surrounded by a cup 33, which has a bottom provided with an exhaust/drain portion (not shown) including an exhaust tube and a drain tube. As shown in FIGS. 5A, there is a chemical liquid supply nozzle 34, which is movable up and down and further movable on a guide 36 in the Y-direction by a drive portion 35.

When the developing unit 3 is used, a wafer W is loaded into the casing 30 by the main arm A1 through one of transfer ports 37 opened to the transfer passage R1 and placed on one of the spin chucks 31. Each of the transfer ports 37 can be opened/closed by a shutter 38, so that the transfer port 37 is closed by the shutter 38 to prevent particles from flowing into the casing 30. The developing liquid is supplied from the supply nozzle 34 onto the surface of the wafer W to form a liquid film of the developing liquid on the surface of the wafer W. Then, a cleaning liquid is supplied from a cleaning liquid supply mechanism (not shown) to wash out the developing liquid on the surface of the wafer W. Then, the wafer W is rotated and thereby dried to complete the developing process.

The shelf units U1 to U4 include thermal process units stacked in two levels and configured to perform a pre-process and a post-process for the process performed in the developing unit 3. The exhaust units 5 are disposed below the shelf units U1 to U4. For example, these thermal process units includes heating units 4 for performing a heat process on a wafer W after the light exposure and a heat process on a wafer W to dry the wafer W after the developing process, and cooling units for adjusting the temperature of a wafer W processed by a heating unit 4 to be a predetermined temperature. Specifically, the shelf units U1, U2, and U3 in each DEV layer B1 include heating units 4 stacked in two levels, and the shelf unit U4 includes cooling units stacked in two levels.

Figure 6:
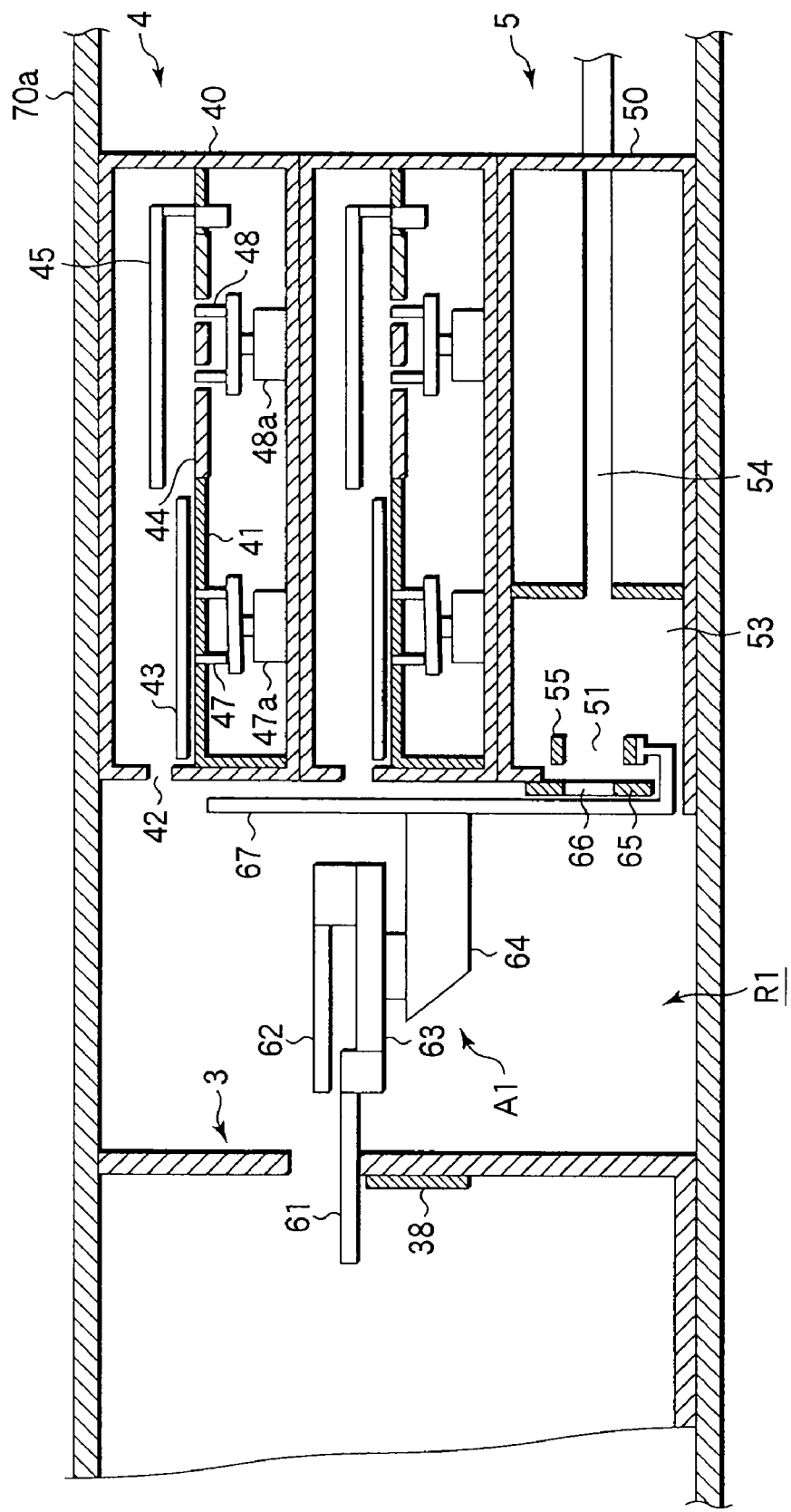
FIG. 6 is a sectional side view showing a main arm and a heating unit in the DEV layer.

As shown in FIG. 6, each of the heating units 4 includes a casing 40, in which a base table 41 is disposed. The casing 40 has a transfer port 42 for a wafer W opened to the transfer passage R1. A cooling plate 43 for rough cooling and a hot plate 44 are disposed in the casing 40. The cooling plate 43 is movable between a cooling position shown in FIG. 6 and a transfer position on the hot plate 44. Lifter pins 47 are used to transfer the wafer W onto the cooling plate 43, and lifter pins 48 are used to transfer the wafer W onto the hot plate 44 and to transfer the wafer W between the cooling plate 43 and hot plate 44.

Although not explained in detail, the cooling unit of the shelf unit U4 is structured as in the heating unit 4, such that it includes a casing having a transfer port 42 opened to the transfer passage R1 and a cooling plate of the water cooling type disposed in the casing.

Further, as shown in FIG. 6, each of the exhaust units 5 includes a casing 50 having a suction port 51 opened to the transfer passage R1 and an exhaust tube 54 for vacuum-exhausting the interior of an exhaust chamber 53 inside the casing. When the exhaust chamber 5 is being caused to have a negative pressure, particles are removed from the transfer passage R1 along with drawn gas.

The main arm A1 is used to transfer wafers W among the process units of the shelf units U1 to U4, the developing unit 3, a transit stage of the first transfer shelf unit T1, and a transit stage of the second transfer shelf unit T2. As shown in FIG. 6, the main arm A1 includes two arm portions 61 and 62 configured to support the peripheral portion of the backside of a wafer W, for example. The arm portions 61 and 62 are movable back and forth independently of each other above a transfer base 63. The transfer base 63 is rotatable about a vertical axis on an elevating base 64. Further, the elevating base 64 is movable up and down on a vertical guide rail 67. In front of the four exhaust units 5 of the shelf units U1 to U4, a horizontal guide rail 65 is disposed, and the main arm A1 is movable on the guide rail 65 along with the vertical guide rail 67 in a horizontal direction. The horizontal guide rail 65 has holes 66 at positions corresponding to the suction ports 51, so that gas is exhausted from the transfer passage R1 through the holes 66. The lower end of the vertical guide rail 67 extends below the guide rail 65 into the exhaust chamber 5, and is attached to a drive belt 55 for moving the vertical guide rail 67 on the guide rail 65.

Next, a brief explanation will be given of other process layers.

Each of the DEV layers B5 has the same structure as the DEV layer B1 described above, and wafers W are transferred in the DEV layer B5 by a main arm A5 having the same structure as the main arm A1. The BCT layer B2, COT layers B3 and B7, and TCT layers B4 and B8 differ from the DEV layer B1 such that the developing unit 3 is replaced with a coating unit of a chemical liquid for forming an anti-reflective film or a chemical liquid (resist liquid) for forming a resist film. These coating units have almost the same basic structure as the developing unit 3. However, unlike the developing unit 3, these coating units are structured such that a chemical liquid for coating is dropped onto the center of a wafer while the spin chuck is rotated, so that the chemical liquid is spread by a centrifugal force to form a coating film. Further, these coating process layers B2 to B4, B7, and B8 include shelf units U1 to U4 partly different from those of the DEV layer B1. Specifically, these coating process layers include the same heating units and cooling units as those of the shelf units U1 to U4 of the DEV layer B1. Further, any one of these process layers includes a periphery light exposure unit for performing light exposure on the peripheral portion of a wafer W. Further, the shelf units U1 to U4 of the COT layers B3 and B7 include a unit for performing a hydrophobic process on a wafer W. The process layers B2, B3, B4, B7, and B8 are respectively provided with main arms A2, A3, A4, A7, and A8 having the same structure as the main arm A1 to transfer wafers W therein.

Figure 7:
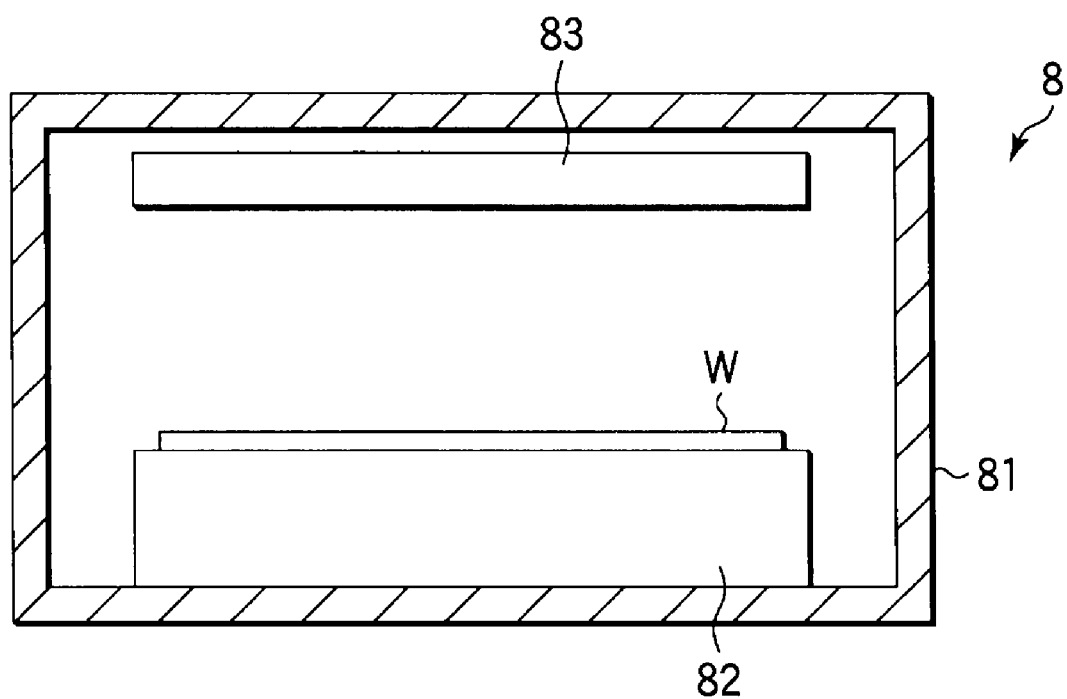
FIG. 7 is a sectional view showing a curing unit in a C/S layer.

The cleaning/surface process layer (C/S layer) B6 differs from the DEV layer B1 such that the developing unit 3 is replaced with a cleaning unit. This cleaning unit has the same basic structure as the developing unit 3, in which a spin chuck is surrounded by a cup. However, unlike the developing unit 3, the cleaning unit is structured such that purified water or a chemical liquid for cleaning is dropped onto the center of a wafer while the spin chuck is rotated, so that the purified water or chemical liquid is spread by a centrifugal force to clean the surface of the wafer W. Further, the cleaning/surface process layer (C/S layer) B6 includes shelf units U1 to U4 partly different from those of the DEV layer B1. Specifically, this process layer includes a curing unit as well as the same heating units and cooling units as those of the shelf units U1 to U4 of the DEV layer B1. As shown in FIG. 7, the curing unit 8 includes a casing 81, in which a wafer support table 82 is disposed. An ultraviolet lamp 83 is disposed to face a wafer W placed on the wafer support table 82, so that it can irradiate the wafer W with ultraviolet rays to perform a curing process on the uppermost layer. The C/S layer B6 is provided with a main arm A6 having the same structure as the main arm A1 to transfer wafers W therein.

Figure 8:
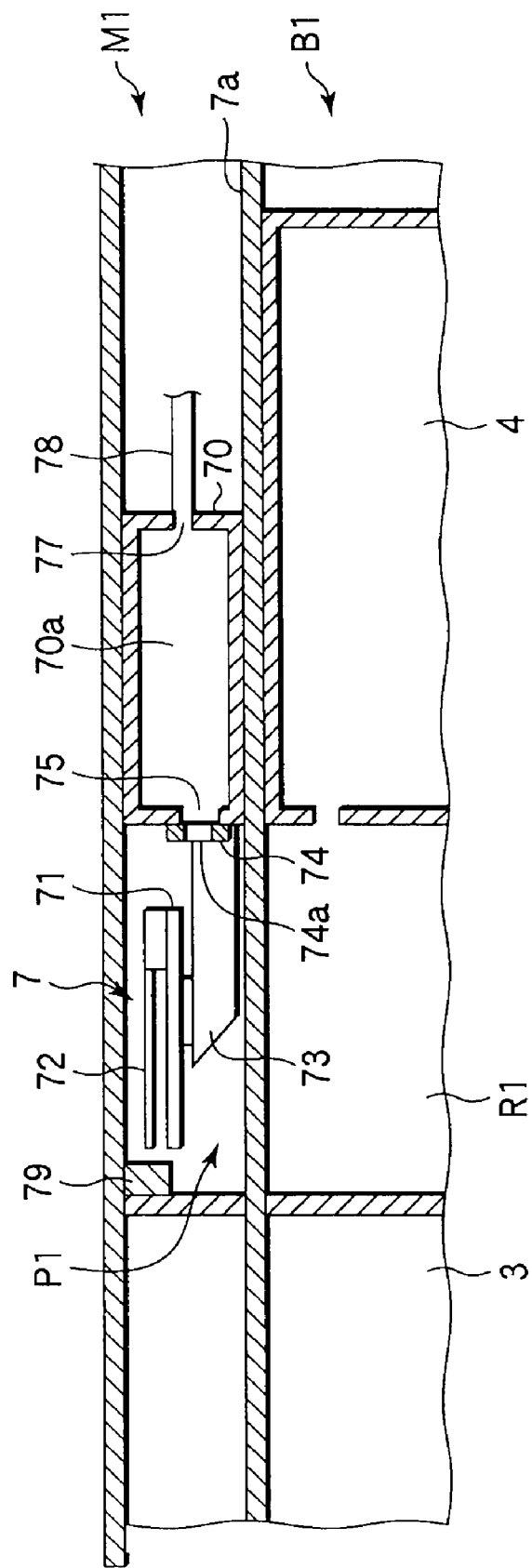
FIG. 8 is a sectional view showing a transfer layer.

As described above, the first transfer layer M1 is disposed between the upper DEV layer B1 and BCT layer B2 in the first sub-block SB1, so that a wafer W can be transferred from the first transfer shelf unit T1 adjacent to the carrier block S1 directly to the intermediate second transfer shelf unit T2. As shown in FIG. 8, the first transfer layer M1 includes a transfer area Pi partitioned from the transfer passage R1 of the DEV layer B1 by a partition plate 7a, and a shuttle arm 7 serving as a direct transfer device. The shuttle arm 7 includes an arm portion 71 configured to support the peripheral portion of the backside of a wafer W and movable back and forth on the transfer base 72. The transfer base 72 is rotatable about a vertical axis on a traveling base 73. A casing 70 is horizontally disposed along the transfer area P1 behind the shuttle arm 7. The casing 70 defines an exhaust chamber 70a therein, which contains a drive portion (not shown) for moving the shuttle arm 7. Along the front side of the casing 70, a guide rail 74 extends in a horizontal direction to guide the shuttle arm 7 in a horizontal direction.

The casing 70 has a suction port 75 opened to the transfer area P1, and the guide rail 74 has holes 74a formed therein and horizontally distant from each other to correspond to the suction port 75. The exhaust chamber 70a has a plurality of exhaust ports 77 horizontally distant from each other on the opposite side to the transfer area P1. The exhaust ports 77 are connected to exhaust tubes 78 for vacuum-exhausting gas from inside the exhaust chamber 70a. When the exhaust chamber 70a is being caused to have a negative pressure through the exhaust tubes 78, gas is forced to flow from the transfer area P1 into the exhaust chamber 70a. For example, the transfer area P1 has a gas introduction portion 79 horizontally extending to cover the entire transfer area P1. The gas introduction portion 79 includes gas introduction ports (not shown) formed at regular intervals to supply a clean gas into the transfer area P1. When a clean gas is supplied into the transfer area P1 while gas is exhausted from inside the transfer area P1 through the exhaust chamber 70a, particles are removed from the transfer area P1. At this time, the clean gas supply and the exhaust are adjusted, so that the pressure inside the transfer area P1 is controlled to be slightly higher than the pressure of the clean room to prevent particles from flowing into the transfer area P1 from outside.

The second transfer layer M2 is disposed as the lowermost layer of the first sub-block SB1, so that a wafer W can be transferred from the second transfer shelf unit T2 directly to the first transfer shelf unit T1. Otherwise, the second transfer layer M2 has the same structure as the first transfer layer M1. The third transfer layer M3 is disposed between the upper DEV layer B5 and C/S layer B6 in the second sub-block SB2, so that a wafer W can be transferred from the intermediate second transfer shelf unit T2 directly to the third transfer shelf unit T3 adjacent to the interface block S3. Otherwise, the third transfer layer M3 has the same structure as the first transfer layer M1. The fourth transfer layer M4 is disposed as the lowermost layer of the second sub-block SB2, so that a wafer W can be transferred from the third transfer shelf unit T3 directly to the second transfer shelf unit T2. Otherwise, the fourth transfer layer M4 has the same structure as the first transfer layer M1.

The first sub-block SB1 includes a first wafer delivery area R2 adjacent to the carrier block S1 and to the transfer passages R1 of the process layers B1 to B4 and the transfer areas P1 of the transfer layers M1 and M2. The first transfer shelf unit T1 is disposed in the delivery area R2. The delivery area R2 further includes a delivery arm D1 serving as a vertical transfer device to deliver wafers W to and from the transfer shelf unit T1.

The first transfer shelf unit T1 includes a transit stage TRSB at a position corresponding to the second transfer layer M2, transit stages TRS1 at positions corresponding to the DEV layers B1, a transit stage TRSA at a position corresponding to the first transfer layer M1, two transit stages TRS2 at positions corresponding to the BCT layer B2, two transit stages TRS3 at positions corresponding to the COT layer B3, and two transit stages TRS4 at positions corresponding to the TCT layer B4.

The transfer arm C can access stages of the first transfer shelf unit T1 between (inclusive) the lowermost transit stage TRSB corresponding to the second transfer layer M2 and the transit stages TRS2 corresponding to the BCT layer B2. The delivery arm D1 can access stages of the first transfer shelf unit T1 between (inclusive) the lowermost transit stage TRSB to the uppermost transit stages TRS4 corresponding to the TCT layer B4.

The delivery arm D1 is movable back and forth and up and down, so that it can move among the respective layers between (inclusive) the lowermost second transfer layer M2 and the uppermost TCT layer B4, and deliver wafers W to and from the transit stages TRSB to TRS4 corresponding to the respective layers.

The shuttle arms 7 of the first and second transfer layers M1 and M2 can respectively access the transit stages TRSA and TRSB corresponding to the respective transfer layers. The main arms A1 to A4 of the DEV layers B1, BCT layer B2, COT layer B3, and TCT layer B4 can respectively access the transit stages TRS1 to TRS4 corresponding to the respective process layers.

A second wafer delivery area R3 is located between the first sub-block SB1 and the second sub-block SB2 to be adjacent to the transfer passages R1 of the process layers B1 to B4 and the transfer areas P1 of the transfer layers M1 and M2, and adjacent to the transfer passages R1 of the process layers B5 to B8 and the transfer areas P1 of the transfer layers M3 and M4. The second transfer shelf unit T2 is disposed in the delivery area R3. The delivery area R3 further includes a delivery arm D2 serving as a vertical transfer device to deliver wafers W to and from the transfer shelf unit T2.

The second transfer shelf unit T2 includes a transit stage TRSD at a position corresponding to the fourth transfer layer M4, transit stages TRS5 at positions corresponding to the DEV layers B5, a transit stage TRSC at a position corresponding to the third transfer layer M3, two transit stages TRS6 at positions corresponding to the C/S layer B6, two transit stages TRS7 at positions corresponding to the COT layer B7, and two transit stages TRS8 at positions corresponding to the TCT layer B8.

The second delivery arm D2 can access the respective stages between (inclusive) the lowermost transit stage TRSD and the uppermost transit stages TRS8 corresponding to the TCT layer B8. The second delivery arm D2 is movable back and forth and up and down, so that it can move among the respective layers between (inclusive) the lowermost fourth transfer layer M4 and the uppermost TCT layer B8, and deliver wafers W to and from the transit stages TRSD to TRS8 corresponding to the respective layers.

The shuttle arms 7 of the third and fourth transfer layers M3 and M4 can respectively access the transit stages TRSC and TRSD corresponding to the respective transfer layers. The main arms A5 to A8 of the DEV layers B5, C/S layer B6, COT layer B7, and TCT layer B8 can respectively access the transit stages TRS5 to TRS8 corresponding to the respective process layers.

A third wafer delivery area R4 is located adjacent to the transfer passages R1 of the DEV layers B5 and the transfer areas P1 of the third and fourth transfer layers M3 and M4. The third transfer shelf unit T3 is disposed in the area R4, as shown in FIG. 2.

The third transfer shelf unit T3 includes a transit stage TRSF at a position corresponding to the fourth transfer layer M4, transit stages TRS9 at positions corresponding to the DEV layers B5, and a transit stage TRSE at a position corresponding to the third transfer layer M3.

The shuttle arms 7 of the third and fourth transfer layers M3 and M4 can respectively access the transit stages TRSE and TRSF corresponding to the respective transfer layers. The main arms A5 of the DEV layers B5 can respectively access the transit stages TRS9 corresponding to the respective process layers.

All the transit stages TRS1 to TRS9 and TRSA to TRSF have the same structure, which includes a rectangular casing with a stage disposed therein to support a wafer W and provided with pins that project and retreat relative to the stage, for example. The stage is further provided with a mechanism for adjusting the temperature of a wafer W to a predetermined value. The casing has a transfer port formed on a side facing the corresponding arm, through which the arm can enter the casing. In a state where the pins hold a wafer separately from the stage, the arm is used to receive the wafer W from below. On the other hand, the arm is used to place a wafer W on the projecting pins, which are then moved down to place the wafer W on the stage.

In this embodiment, two transit stages are disposed for each of the process layers B2 to B4 and B6 to B8, and one stage is disposed for each of the DEV layers B1 and B5 and transfer layers M1 to M4. However, this is not limiting, and the number of transit stages for each layer can be suitably determined in accordance with the planned transfer sequence.

The interface block S3 includes a buffer unit 9 configured to accommodate a plurality of wafers W and used for temporarily placing wafers to be loaded to the light exposure apparatus 200 and wafers W unloaded from the light exposure apparatus 200. The buffer unit 9 includes a second loading buffer cassette ($Bu_{IN}2$) 93, a first loading buffer cassette ($Bu_{IN}1$) 91, a first unloading buffer cassette ($Bu_{OUT}1$) 92, and a second unloading buffer cassette ($Bu_{OUT}2$) 94 in this order from above (see FIG. 3). The first loading buffer cassette ($Bu_{IN}1$) 91 is used for placing wafers W to be loaded into the light exposure apparatus 200 before the first (first round) light exposure. The first unloading buffer cassette ($Bu_{OUT}1$) 92 is used for placing wafers W unloaded from the light exposure apparatus 200 after the first light exposure. The second loading buffer cassette ($Bu_{IN}2$) 93 is used for placing wafers W to be loaded into the light exposure apparatus 200 before the second (second round) light exposure. The second unloading buffer cassette ($Bu_{OUT}2$) 94 is used for placing wafers W unloaded from the light exposure apparatus 200 after the second light exposure.

Between the buffer unit 9 and process block S2, there is a loading interface arm E1 for inserting coated wafers W into the loading buffer cassette 91 or 93 and an unloading interface arm E2 for taking out wafers W from the unloading buffer cassette 92 or 94. The interface arms E1 and E2 can also access the transit stages TRS9, TRSE, and TRSF of the transfer shelf unit T3. When a wafer W is inserted into the loading buffer cassette 91 or 93, the wafer W is delivered by the shuttle arm 7 of the third transfer layer M3 to the transit stage TRSE, and is inserted into the cassette by the loading interface arm E1. When a wafer W taken out from the unloading buffer cassette 92 or 94 is returned, the wafer W is transferred by the unloading interface arm E2 to the transit stage TRS9 or TRSF.

Further, there is a first light exposure interface arm E3 for transferring a wafer W for the first light exposure between the buffer unit 9 and light exposure apparatus 200 and a second light exposure interface arm E4 for transferring a wafer W for the second light exposure between the buffer unit 9 and light exposure apparatus 200.

Figure 9:
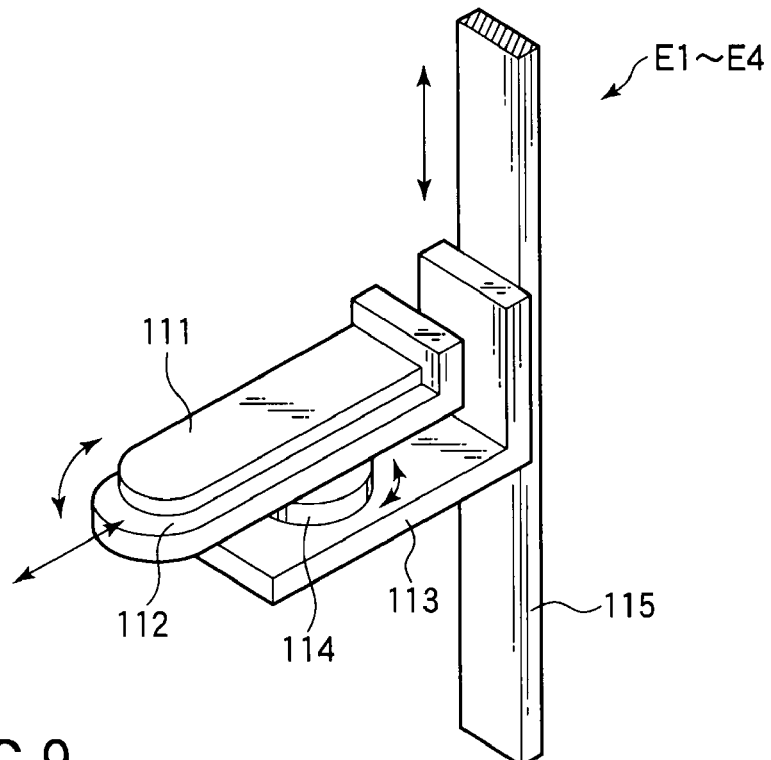
FIG. 9 is a perspective view schematically showing an interface arm.

These interface arms E1 to E4 have the same structure, such as a structure shown in FIG. 9, in which one arm 111 for supporting the central portion of the backside of a wafer W is movable back and forth on a base plate 112. The base plate 112 is mounted on an elevating table 113 through a rotation mechanism 114 to be rotatable about a vertical axis, and is movable up and down on a vertical rail 115. Accordingly, the arm 111 is movable back and forth and up and down, and is rotatable about a vertical axis. Each of the delivery arms D1 and D2 has the same structure as the interface arms E1 to E4 except that it is not rotatable about a vertical axis.

Figure 10:
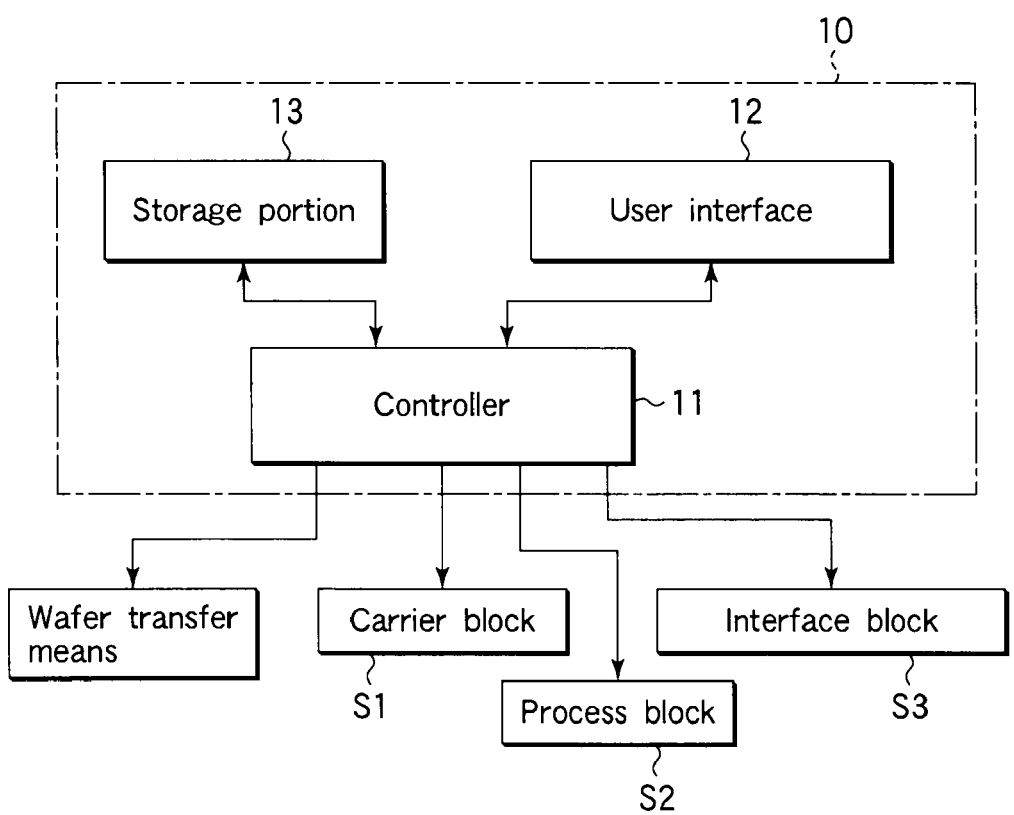
FIG. 10 is a view showing a control system for controlling the substrate processing system according to this embodiment.

Next, an explanation will be given of a control section 10. FIG. 10 is a block diagram showing a main part of the control section 10.

The control section 10 includes a controller 11 comprising a micro processor (MPU) for controlling the respective components included in the substrate processing system 100, such as wafer transfer means, e.g., the main arms A1 to A8, shuttle arms 7, transfer arm C, delivery arms D1 and D2, and interface arms E1 to E4, and the respective units in the carrier block S1, process block S2, and interface block S3. The control section 10 further includes a user interface 12, which includes, e.g., a keyboard and a display, wherein the keyboard is used for an operator to input commands for operating the respective components in the substrate processing system 100, and the display is used for showing visualized images of the operational status of the respective components in the substrate processing system 100. The control section 10 further includes a storage portion 13, which stores data, such as recipes necessary for processes.

The storage portion 23 stores control programs for realizing various processes performed in the substrate processing system 100 under the control of the controller 11, and programs or recipes for providing process sequences and transfer schedules of wafers W in the substrate processing system 100. The transfer schedules provided by the recipes are arranged to designate transfer routes of wafers W in accordance with the type of processes (the order of modules, such as transit stages and units, to which a wafer W is transferred). An operator can select a recipe to be executed, from a plurality of recipes. The control programs, such as recipes, are stored in the storage medium of the storage portion 13. The storage medium may be of a stationary type, such as a hard disk, or a potable type, such as a CDROM, DVD, or flash memory. Alternatively, the recipes may be used online while they are transmitted from another apparatus through, e.g., a dedicated line, as needed.

An explanation will be given of process operations for wafers W in the substrate processing system 100 having the structure described above.

At first, double patterning for forming a fine pattern in a predetermined film on a wafer W will be explained with reference to FIGS. 11A to 11F, wherein the double patterning is performed in the substrate processing system 100 according to this embodiment. It should be noted that FIGS. 11A to 11F show only a substrate, an etching target film, and a resist film for the sake of simplicity, but actual patterns include an anti-reflective film, an underlying film, a hard mask layer, an etching stopper layer, and so forth suitably arranged.

At first, as shown in FIG. 11A, the first resist coating process is performed on an etching target film 302 formed on a semiconductor substrate (wafer) 301 to form a resist film 303 (first coating).

Then, as shown in FIG. 11B, the first light exposure and first developing process are performed to form the first resist pattern having a patterned portion 304 (first patterning).

Then, as shown in FIG. 11C, a surface process (curing, coating, or the like) is performed on the patterned portion 304 to form a surface-processed part 305 (pattern surface process), so that the first patterned portion 304 is prevented from being adversely affected by a subsequent resist for the second coating due to reaching or the like caused therebetween Then, as shown in FIG. 11D, the second resist coating process is performed on the first resist pattern to form a resist film 306 (second coating).

Then, as shown in FIG. 11E, the second light exposure and second developing process are performed to form a patterned portion 307 including parts between adjacent parts of the first patterned portion 304 (second patterning).

Then, the wafer processed up to the second patterning is subjected to etching in a separate etching apparatus to form a fine etching pattern, as shown in FIG. 11F, (etching).

In the substrate processing system 100, the double patterning is performed, as shown in FIGS. 11A to 11F, by the following process operations.

Figure 12:
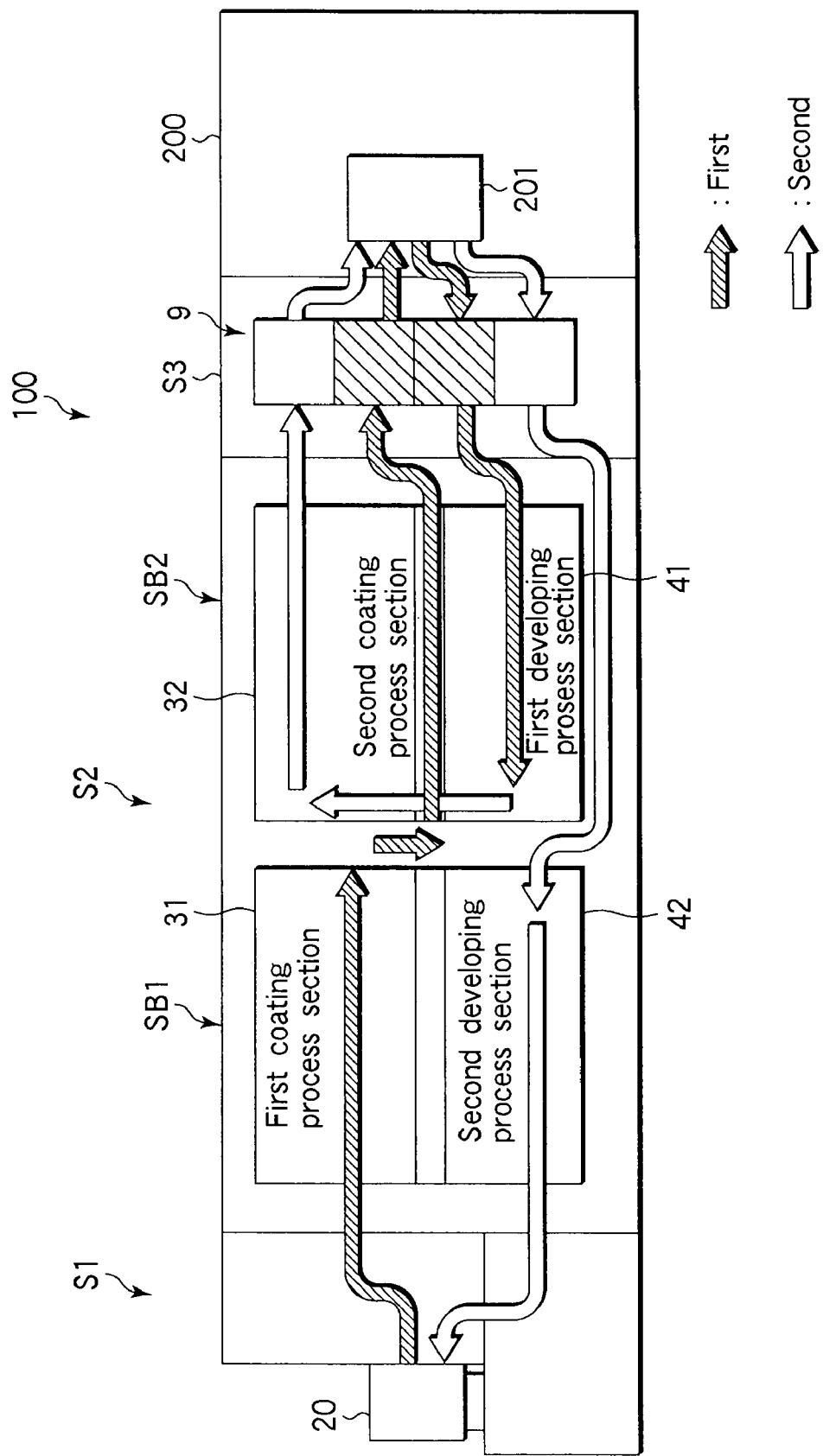
FIG. 12 is a view schematically showing process operations performed in the substrate processing system and light exposure apparatus according to this embodiment.

FIG. 12 is a view schematically showing process operations performed in the substrate processing system 100 and light exposure apparatus 200 according to this embodiment. In FIG. 12, the black arrows denote processes for the first (first round) patterning, and white arrows denote processes for the second (second round) patterning. In this embodiment, as shown in FIG. 12, a carrier 20 storing a first lot of wafers W is set on the carrier block S1, and the wafers W are taken out one by one from the carrier 20. The wafers W thus taken out are subjected to the first resist film formation and so forth in the first coating process section 31, and then are sequentially inserted into the first loading buffer cassette ($Bu_{IN}1$) 91 of the buffer unit 9 in the interface block S3. After one lot of wafers W are stored in the first loading buffer cassette ($Bu_{IN}1$) 91, the wafers W are sequentially transferred to a stage 201 in the light exposure apparatus 200 and the first light exposure process is started.

Subsequently, a carrier 20 storing a second lot of wafers W is set on the carrier block S1, and the wafers W are taken out one by one from the carrier 20. The wafers W thus taken out are subjected to the first resist film formation and so forth, and then are sequentially inserted into the first loading buffer cassette ($Bu_{IN}1$) 91, as in the first lot. After one lot of wafers W are stored in the first loading buffer cassette ($Bu_{IN}1$) 91, the wafers W are sequentially transferred to the stage 201 in the light exposure apparatus 200 and the first light exposure process is started, as in the first lot.

On the other hand, after subjected to the first light exposure, the first lot of wafers W are unloaded to the stage 201, and are sequentially inserted into the first unloading buffer cassette ($Bu_{OUT}1$) 92. Then, the wafers W are sequentially taken out from the first unloading buffer cassette ($Bu_{OUT}1$)

92, and are subjected to the first developing process in the first developing process section 41. After the first developing process, the wafers W are subjected to the second resist film formation and so forth in the second coating process section 32. Then, the wafers W are sequentially inserted into the second loading buffer cassette ($Bu_{IN}2$) 93 of the buffer unit 9 in the interface block S3.

At this time, the reticle of the light exposure apparatus 200 is replaced with a reticle for the second light exposure, when the first light exposure on the second lot of wafers W is finished. After this operation and the first lot of wafers W are stored in the second loading buffer cassette ($Bu_{IN}2$) 93, the wafers are sequentially transferred to the stage 201 in the light exposure apparatus 200 and the second light exposure process is started.

While these processes are being performed, a third lot of wafers W and a fourth lot of wafers W start being processed with suitable timings.

After subjected to the second light exposure, the first lot of wafers W are unloaded to the stage 201, and are sequentially inserted into the second unloading buffer cassette ($Bu_{OUT}2$) 94. Then, the wafers W are sequentially taken out from the second unloading buffer cassette ($Bu_{OUT}2$) 94, and are subjected to the second developing process in the second developing process section 42. After the second developing process, the wafers W are returned to a carrier 20. Similarly, after subjected to the first light exposure, the second lot of wafers W are subjected to the first developing process in the first developing process section 41 and the second resist film form process in the second coating process section 32. Then, the second lot of wafers W are subjected to the second light exposure and the second developing process, and are returned to a carrier 20.

According to this embodiment, a number of lots of wafers W are sequentially subjected to the processes described above, while the first coating and developing processes and the second coating and developing processes are performed in the respective process sections in the substrate processing system 100. Consequently, the two patterning operations are sequentially performed without taking wafers W out of the system 100, and the double patterning can be realized with remarkably high efficiency. Further, for the two light exposure operations in the light exposure apparatus 200, the first coating and developing processes and the second coating and developing processes are performed in the respective process sections in the substrate processing system 100. Accordingly, in the normal state, the wafer process throughput of the substrate processing system 100 as a whole is allowed to be a half of the throughput of the light exposure apparatus 200. In other words, the substrate processing system 100 can lessen its burden without following an increase in the throughput of the light exposure apparatus. Specifically, the double patterning process requires the throughput of the light exposure apparatus to be 200 to 300 wafers per hour. In this respect, if a conventional coating/developing system is used, the system needs to increase its current throughput of 100 to 150 wafers per hour to a throughput of 200 to 300 wafers per hour, in accordance with the throughput of the light exposure apparatus, thereby bringing about a big burden to the system. On the other hand, where the substrate processing system 100 according to this embodiment is used, the system is allowed to maintain the current throughput of 100 to 150 wafers per hour, thereby lessening the system burden.

However, where two systems having different throughputs are connected and wafers are transferred therebetween, as in this case, buffering of wafers is essential in the connecting portion therebetween. In light of this, according to this embodiment, the buffer unit 9 is disposed in charge of buffering of wafers. Specifically, when wafers W are transferred from the substrate processing system 100 having a lower throughput to the light exposure apparatus 200 having a higher throughput, the throughput is locally doubled at a portion corresponding to the buffer unit. If there is no buffer at this portion, an ordinary transfer arm cannot keep up with supply of wafers W to the light exposure apparatus 200. Further, the reticle of the light exposure apparatus 200 is replaced between the first light exposure and second light exposure, and so wafers need to be treated for each lot. Accordingly, a loading buffer is essential to this embodiment. On the other hand, when wafers W are unloaded from the light exposure apparatus 200, a transfer arm that provides a performance corresponding to the throughput of the light exposure apparatus 200 can handle this transfer. Accordingly, an unloading buffer is not essential to this embodiment, but is preferably used in practice in light of a difference in throughput.

Further, according to this embodiment, the first coating process section 31, second coating process section 32, first developing process section 41, and second developing process section 42 are disposed one on top of the other. This arrangement can decrease the footprint of the system, although the two coating processes and the two developing processes of a resist or the like are respectively performed in the system. Specifically, the second developing process section 42 and first coating process section 31 are stacked in this order from below to form a multi-layered body. The first developing process section 41 and second coating process section 32 are stacked in this order from below to form another multi-layered body. These multi-layered bodies are disposed side by side, so that transfer of wafers can be efficiently performed.

Further, sections for performing each process is combined in one process layer, and the process layers are stacked one on top of the other. This arrangement can also decrease the footprint of the system.

Further, the process layers are arranged to allow the two coating processes and the two developing processes of a resist or the like to be performed while wafers are efficiently transferred in a manner like drawing with a single stroke. This arrangement can further increase the process efficiency.

Next, an explanation will be given of specific process operations.

A carrier 20 storing a plurality of wafers is transferred from outside onto the carrier block Si, and the wafers W are taken out by the transfer arm C one by one from the carrier 20 and transferred into the process block S2. Then, at first, the wafers W are subjected to the first coating process in the first coating process section 31 of the first sub-block SB1. Specifically, at first, each wafer W is delivered by the transfer arm C onto one of the transit stages TRS2 of the first transfer shelf unit T1. The wafer W is taken out from this transit stage TRS2 by the main arm A2 of the BCT layer B2, and is transferred to the cooling unit, anti-reflective film forming unit (which corresponds to the developing unit 3 shown in FIG. 5), and heating unit in this order, to sequentially perform predetermined processes so as to form a lower anti-reflective film (BARC). Then, the wafer W is returned onto one of the transit stages TRS2.

Then, the wafer W is transferred by the delivery arm D1 from this transit stage TRS2 onto one of the transit stages TRS3 of the COT layer B3. The wafer W is taken out from this transit stage TRS3 by the main arm A3 of the COT layer B3, and is transferred to the cooling unit, resist coating unit (which corresponds to the developing unit 3 shown in FIG. 5), and heating unit in this order, to sequentially perform predetermined processes so as to form a resist film on the lower anti-reflective film. Then, the wafer W is transferred to the periphery light exposure unit and is subjected to a periphery light exposure process. Then, the wafer W is returned onto one of the transit stages TRS3.

Then, the wafer W is transferred by the delivery arm D1 from this transit stage TRS3 onto one of the transit stages TRS4 of the TCT layer B4. The wafer W is taken out from this transit stage TRS4 by the main arm A4 of the TCT layer B4, and is transferred to the cooling unit, second anti-reflective film forming unit (which corresponds to the developing unit 3 shown in FIG. 5), and heating unit in this order, to sequentially perform predetermined processes so as to form an upper anti-reflective film (TARC) on the resist film. Then, the wafer W is returned onto one of the transit stages TRS4.

In this way, the first coating process is finished.

Then, the wafer W is transferred by the delivery arm D1 from this transit stage TRS4 onto the transit stage TRSA. Then, the wafer W is taken out from the transit stage TRSA by the shuttle arm 7 of the first transfer layer M1, which is then turned around to face the second transfer shelf unit T2 and is moved to the second transfer shelf unit T2, and the wafer W is transferred by this shuttle arm 7 onto the transit stage TRSC of the second transfer shelf unit T2. Then, the wafer W is taken out from the transit stage TRSC by the shuttle arm 7 of the third transfer layer M3 in the second sub-block SB2, which is then turned around to face the third transfer shelf unit T3 and is moved to the third transfer shelf unit T3, and the wafer W is transferred by this shuttle arm 7 onto the transit stage TRSE of the third transfer shelf unit T3. The wafer W is transferred by the loading interface arm E1 in the interface block S3 from the transit stage TRSE into the first loading buffer cassette ($Bu_{IN}1$) 91 of the buffer unit 9.

After one lot of wafers W are stored in the first loading buffer cassette ($Bu_{IN}1$) 91, the wafers W are transferred by the first light exposure interface arm E3 into the light exposure apparatus 200. Then, the wafers W are subjected to the first light exposure in the light exposure apparatus 200.

After subjected to the first light exposure, the wafers W are unloaded to the interface block S3. At this time, the wafers W are transferred by the first light exposure interface arm E3 into the first unloading buffer cassette ($Bu_{OUT}1$) 92.

Then, the wafers W are transferred from the first unloading buffer cassette ($Bu_{OUT}1$) 92 into the process block S2, and are subjected to the first developing process in the first developing process section 41 in the second sub-block SB2. Specifically, each wafer W is taken out from the first unloading buffer cassette ($Bu_{OUT}1$) 92 by the unloading interface arm E2 and is transferred onto one of the transit stages TRS9 of the third transfer shelf unit T3 corresponding to the DEV layers B5. Then, the wafer W is taken out from this transit stage TRS9 by the main arm A5 of the corresponding one of the DEV layers B5, and is transferred to the heating unit 4, cooling unit, developing unit 3, heating unit 4, and cooling unit in this order, which are included in the shelf units U1 to U4 of this DEV layer B5, to perform predetermined processes, such as a post-light-exposure baking process, developing process, and post-baking process. After subjected to the developing process, the wafer W is transferred onto the corresponding one of the transit stages TRS5 of the second transfer shelf unit T2. In this way, the first developing process is finished.

Subsequently, the wafer W is subjected to the second coating process in the second coating process section 32 of the second sub-block SB2. Specifically, at first, the wafer W is delivered by the delivery arm D2 from this transit stage TRS5 onto the one of the transit stages TRS6. The wafer W is taken out from this transit stage TRS6 by the main arm A6 of the C/S layer B6, and is transferred to the cleaning process unit (which corresponds to the developing unit 3 shown in FIG. 5), heating unit, cooling unit, and curing unit 8 in this order, to perform a cleaning process and a curing process serving as a surface process by use of, e.g., ultraviolet rays on the pattern formed by the first coating, light exposure, developing processes. The processes of the C/S layer B6 are conceived to prevent particle deposition and reaching from being caused in the second coating process. Then, the wafer W is returned onto one of the transit stages TRS6.

Then, the wafer W is transferred by the delivery arm D2 from this transit stage TRS6 onto one of the transit stages TRS7 of the COT layer B7. The wafer W is taken out from this transit stage TRS7 by the main arm A7 of the COT layer B7, and is transferred to the cooling unit, resist coating unit (which corresponds to the developing unit 3 shown in FIG. 5), and heating unit in this order, to sequentially perform predetermined processes so as to form a resist film on the upper anti-reflective film formed by the first coating process. Then, the wafer W is transferred to the periphery light exposure unit and is subjected to a periphery light exposure process. Then, the wafer W is returned onto one of the transit stages TRS7.

Then, the wafer W is transferred by the delivery arm D2 from this transit stage TRS7 onto one of the transit stages TRS8 of the TCT layer B8. The wafer W is taken out from this transit stage TRS8 by the main arm A8 of the TCT layer B8, and is transferred to the cooling unit, second anti-reflective film forming unit (which corresponds to the developing unit 3 shown in FIG. 5), and heating unit in this order, to sequentially perform predetermined processes so as to form an upper anti-reflective film (TARC) on the resist film. Then, the wafer W is returned onto one of the transit stages TRS8.

In this way, the second coating process is finished.

Then, the wafer W is transferred by the delivery arm D2 from this transit stage TRS8 onto the transit stage TRSC of the second transfer shelf unit T2. Then, the wafer W is taken out from the transit stage TRSC by the shuttle arm 7 of the first transfer layer M3, which is then turned around to face the third transfer shelf unit T3 and is moved to the third transfer shelf unit T3, and the wafer W is transferred by this shuttle arm 7 onto the transit stage TRSE of the third transfer shelf unit T3. The wafer W is transferred by the loading interface arm E1 in the interface block S3 from the transit stage TRSE into the second loading buffer cassette ($Bu_{IN}2$) 93 of the buffer unit 9.

After one lot of wafers W are stored in the second loading buffer cassette ($Bu_{IN}2$) 93, the wafers W are transferred by the second light exposure interface arm E4 into the light exposure apparatus 200. Then, the wafers W are subjected to the second light exposure in the light exposure apparatus 200.

After subjected to the second light exposure, the wafers W are unloaded to the interface block S3. At this time, the wafers W are transferred by the second light exposure interface arm E4 into the second unloading buffer cassette ($Bu_{OUT}2$) 94.

Then, the wafers W are transferred from the second unloading buffer cassette ($Bu_{OUT}2$) 94 into the process block S2, and are subjected to the second developing process in the second developing process section 42 in the first sub-block SB1. Specifically, each wafer W is taken out from the second unloading buffer cassette ($Bu_{OUT}2$) 94 by the unloading interface arm E2 and is transferred to the delivery unit TRSF of the third transfer shelf unit T3 corresponding to the fourth transfer layer M4. Then, the wafer W is taken out from the transit stage TRSF by the shuttle arm 7 of the first transfer layer M4, which is then turned around to face the second transfer shelf unit T2 and is moved to the second transfer shelf unit T2, and the wafer W is transferred by this shuttle arm 7 onto the transit stage TRSD of the second transfer shelf unit T2. Then, the wafer W is transferred by the delivery arm D2 from the transit stage TRSD onto one of the transit stages TRS5 corresponding to the DEV layers B1 of the second developing process section 42 of the first sub-block SB1. Then, the wafer W is taken out from this transit stage TRS5 by the main arm A1 of the corresponding one of the DEV layers B1, and is transferred to the heating unit 4, cooling unit, developing unit 3, heating unit 4, and cooling unit in this order, which are included in the shelf units U1 to U4 of this DEV layer B1, to perform predetermined processes, such as a post-light-exposure baking process, developing process, and post-baking process. After subjected to the developing process, the wafer W is transferred onto the corresponding one of the transit stages TRS1 of the first transfer shelf unit T1. In this way, the second developing process is finished. In the transfer sequence described above, the second transfer layer M2 does not need to be used, but it may be used as by-pass means in a case where some trouble is caused in the system, or used as transfer means for another route in a case where processes are complex.

After subjected to the second developing process, the wafer W is transferred by the transfer arm C from this transit stage TRS1 into the carrier 20. These processes are sequentially performed on a plurality of lots of wafers W.

According to the transfer sequence described above, predetermined processes are performed in each of the process layers while wafers are transferred to the respective units by the main arm of this process layer. Further, wafers are transferred to another process layer disposed above and below this process layer by a transfer mechanism movable in the vertical direction. Further, wafers are transferred by the shuttle arm of a transfer layer to by-pass process layers. Consequently, transfer of wafers can be performed with remarkably high efficiency.

The embodiment of the present invention described above is compatible with a light exposure apparatus which performs light exposure at least twice on each substrate. For the first light exposure, a first coating process section for performing the first coating process and a first developing process section for performing the first developing process are disposed. For the second light exposure, a second coating process section for performing the second coating process and a second developing process section for performing the second developing process are disposed. Consequently, a plurality of patterning processes are sequentially performed without taking substrates out of the system, and thus the patterning processes can be performed with remarkably high efficiency.

Further, the buffer unit is disposed in the interface block to set the throughput of the substrate processing system to be a half of the throughput of the light exposure apparatus. Consequently, the substrate processing system can lessen its burden without following an increase in the throughput of the light exposure apparatus.

The present invention has been described with reference to a typical embodiment, but the present invention is not limited to the embodiment described above, and it may be modified in various manners. For example, in the embodiment described above, the substrate processing system has a structure formed of process layers stacked one on top of the other. However, another structure may be employed as long as it can perform the first coating process, first developing process, second coating process, and second developing process.

In the embodiment described above, the first coating process is arranged to form the lower anti-reflective film, resist film, and upper anti-reflective film. However, one of the lower anti-reflective film and upper anti-reflective film may be omitted or both of them may be omitted to use solely the resist film. The second coating process is arranged to perform the cleaning process and the curing process used as a surface process, and then to form the resist film and upper anti-reflective film. However, one of the cleaning process and surface process may be omitted. The surface process is a curing process using ultraviolet ray irradiation, but it may be a curing process using another type of energy rays or heat, or it may be another surface process, such as coating.

In the embodiment described above, the target substrate is exemplified by a semiconductor wafer, but the present invention may be applied to a processing system for processing another substrate, such as an LDC glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing system used for a light exposure apparatus which performs light exposure at least twice on each of a plurality of substrates, the substrate processing system comprising:

a carrier block that transfers therefrom and thereto a carrier storing the substrates;

a process section that performs a coating process to form a coating film including a photosensitive material film on each of the substrates transferred from the carrier block one by one, and that performs a developing process to develop the photosensitive material film subjected to light exposure in accordance with a predetermined light exposure pattern;

an interface block that transfers the substrates between the process section and the light exposure apparatus which performs light exposure on the photosensitive material film in accordance with the predetermined light exposure pattern; and a substrate transfer mechanism that transfers the substrates among the carrier block, the process section, and the interface block, wherein the process section includes a first coating process section that performs a first coating process and a first developing process section that performs a first developing process for a first light exposure, and a second coating process section that performs a second coating process and a second developing process section that performs a second developing process for a second light exposure, and wherein the interface block includes a buffer unit to buffer the substrates, and performs buffering of the substrates at the buffer unit to set the throughput thereof to be a half of the throughput of the light exposure apparatus.

2. The substrate processing system according to claim 1, wherein the buffer unit includes a loading buffer cassette to buffer the substrates to be loaded into the light exposure apparatus.

3. The substrate processing system according to claim 2, wherein the buffer unit further includes an unloading buffer cassette to buffer the substrates unloaded from the light exposure apparatus.

4. The substrate processing system according to claim 3, wherein one or both of the loading buffer cassette and the unloading buffer cassette include a cassette for the first light exposure and a cassette for the second light exposure.

5. The substrate processing system according to claim 1, wherein the substrate processing system further comprises:

a transfer control mechanism that controls the substrate transfer mechanism in transferring the substrates, and the transfer control mechanism is preset to control the substrate transfer mechanism, such that each substrate is transferred from the carrier in the carrier block into the first coating process section in the process section, then each substrate subjected to the first coating process in the first coating process section is transferred through the interface block into the light exposure apparatus, then each substrate subjected to the first light exposure in the light exposure apparatus is transferred through the interface block into the first developing process section in the process section, then each substrate subjected to the first developing process in the first developing process section is transferred into the second coating process section, then each substrate subjected to the second coating process in the second coating process section is transferred through the interface block into the light exposure apparatus, then each substrate subjected to the second light exposure in the light exposure apparatus is transferred through the interface block into the second developing process section in the process section, and then each substrate subjected to the second developing process in the second developing process section is transferred into the carrier in the carrier block.

6. A substrate processing system used for a light exposure apparatus which performs light exposure at least twice on each of a plurality of substrates, the substrate processing system comprising:

a carrier block that transfers therefrom and thereto a carrier storing the substrates;

a process section that performs a coating process to form a coating film including a photosensitive material film on each of the substrates transferred from the carrier block one by one, and that performs a developing process to develop the photosensitive material film subjected to light exposure in accordance with a predetermined light exposure pattern;

an interface block that transfers the substrates between the process section and the light exposure apparatus which performs light exposure on the photosensitive material film in accordance with the predetermined light exposure pattern; and a substrate transfer mechanism that transfers the substrates among the carrier block, the process section, and the interface block, wherein the process section includes a first coating process section that performs a first coating process and a first developing process section that performs a first developing process for a first light exposure, and a second coating process section that performs a second coating process and a second developing process section that performs a second developing process for a second light exposure, and wherein the first coating process section, the first developing process section, the second coating process section, and the second developing process section are stacked such that the second developing process section and the first coating process section are stacked in this order from below to form a first multi-layered body, the first developing process section and the second coating process section are stacked in this order from below to form a second multi-layered body, and the first and second multi-layered bodies are disposed side by side.

7. The substrate processing system according to claim 6, wherein each of the first coating process section and the second coating process section includes a photosensitive material film coating process layer that includes integrated units for coating the photosensitive material film, each of the first developing process section and the second developing process section includes a developing process layer that includes integrated units to perform a corresponding one of the first and second developing processes, and wherein the substrate transfer mechanism includes main transfer devices that transfer the substrates to the integrated units respectively in the photosensitive material film coating process layer and the developing process layer, and includes a delivery mechanism connecting the process layers respectively in the first multi-layered body and the second multi-layered body.

8. The substrate processing system according to claim 7, wherein, in addition to the photosensitive material film coating process layer, the first coating process section includes at least one of a lower anti-reflective film coating process layer that includes integrated units for forming an anti-reflective film below the photosensitive material film and an upper anti-reflective film coating process layer that includes integrated units to form an anti-reflective film above the photosensitive material film.

9. The substrate processing system according to claim 7, wherein, in addition to the photosensitive material film coating process layer, the second coating process section includes a cleaning/surface process layer that includes integrated units to perform at least one of a cleaning process and a surface process on a coating film formed by the first coating process in the first coating process section.

10. The substrate processing system according to claim 9, wherein the cleaning/surface process layer performs a curing process as the surface process.

11. The substrate processing system according to claim 7, wherein, in addition to the photosensitive material film coating process layer, the second coating process section includes an upper anti-reflective film coating process layer that includes integrated units to form an anti-reflective film above the photosensitive material film.

12. A substrate processing method executed in a substrate processing system used for a light exposure apparatus which performs light exposure at least twice on each of a plurality of substrates, the substrate processing system including a carrier block that transfers therefrom and thereto a carrier storing the substrates, a process section that performs a coating process for forming a coating film including a photosensitive material film on each of the substrates transferred from the carrier block one by one, and that performs a developing process to develop the photosensitive material film subjected to light exposure in accordance with a predetermined light exposure pattern, an interface block that transfers the substrates between the process section and the light exposure apparatus which performs light exposure on the photosensitive material film in accordance with the predetermined light exposure pattern, and a substrate transfer mechanism that transfers the substrates among the carrier block, the process section, and the interface block, wherein the process section includes a first coating process section that performs a first coating process and a first developing process section that performs a first developing process for a first light exposure, and a second coating process section that performs a second coating process and a second developing process section that performs a second developing process for a second light exposure, the substrate processing method comprising:
- transferring the substrates, such that each substrate is transferred from the carrier in the carrier block into the first coating process section in the process section, then
- transferring each substrate subjected to the first coating process in the first coating process section through the interface block into the light exposure apparatus, then
- transferring each substrate subjected to the first light exposure in the light exposure apparatus through the interface block into the first developing process section in the process section, then
- transferring each substrate subjected to the first developing process in the first developing process section into the second coating process section, then
- transferring each substrate subjected to the second coating process in the second coating process section through the interface block into the light exposure apparatus, then
- transferring each substrate subjected to the second light exposure in the light exposure apparatus through the interface block into the second developing process section in the process section, and then
- transferring each substrate subjected to the second developing process in the second developing process section into the carrier in the carrier block.

13. A non-transitory computer readable storage medium storing a program for execution on a computer, that when executed, causes the computer to control the substrate processing system to conduct the substrate processing method according to claim 12.

14. A substrate processing method executed in a substrate processing system used for a light exposure apparatus which performs light exposure at least twice on each of a plurality of substrates, the substrate processing system including
- a carrier block that transfers therefrom and thereto a carrier storing the substrates,
- a process section that performs a coating process to form a coating film including a photosensitive material film on each of the substrates transferred from the carrier block one by one, and that performs a developing process to develop the photosensitive material film subjected to light exposure in accordance with a predetermined light exposure pattern,
- an interface block that transfers the substrates between the process section and the light exposure apparatus which performs light exposure on the photosensitive material film in accordance with the predetermined light exposure pattern, and
- a substrate transfer mechanism that transfers the substrates among the carrier block, the process section, and the interface block,
- wherein the process section includes a first coating process section that performs a first coating process and a first developing process section that performs a first developing process for a first light exposure, and a second coating process section that performs a second coating process and a second developing process section that performs a second developing process for a second light exposure, the substrate processing method comprising:
- performing buffering of the substrates in the interface block to set the throughput thereof to be a half of the throughput of the light exposure apparatus.

15. A non-transitory computer readable storage medium storing a program for execution on a computer, that when executed, causes the computer to control the substrate processing system to conduct the substrate processing method according to claim 14.

* * * * *